United States Patent [19]

Joyce et al.

[11] Patent Number: 4,813,002
[45] Date of Patent: Mar. 14, 1989

[54] HIGH SPEED HIGH DENSITY DYNAMIC ADDRESS TRANSLATOR

[75] Inventors: Thomas F. Joyce, Westford; Eugene Nusinov, Sharon; Richard P. Brown, Action, all of Mass.

[73] Assignee: Honeywell Bull Inc., Waltham, Mass.

[21] Appl. No.: 887,768

[22] Filed: Jul. 21, 1986

[51] Int. Cl.[4] .................. G11C 15/00; G06F 12/10
[52] U.S. Cl. ................................. 365/49; 365/231; 364/900
[58] Field of Search ... 364/200 MS File, 900 MS File; 365/49, 231

[56] References Cited

U.S. PATENT DOCUMENTS

| 3,184,717 | 5/1965 | Behnke | 365/49 X |
| 3,195,109 | 7/1965 | Behnke | 364/900 |
| 3,261,000 | 7/1966 | Behnke | 365/49 |
| 3,609,702 | 9/1971 | Gardner et al. | 365/49 |
| 3,633,182 | 1/1972 | Koo | 365/49 |
| 3,668,656 | 6/1972 | Hoggar | 365/49 |
| 3,693,170 | 9/1972 | Ellis et al. | 365/49 |
| 3,800,286 | 3/1974 | Brown et al. | 364/200 |
| 4,538,241 | 8/1985 | Levin et al. | 364/900 |
| 4,538,243 | 8/1985 | Zehner | 365/49 |

OTHER PUBLICATIONS

Weste, Principles of CMOS VLSI Design, 1985.

Primary Examiner—Gary V. Harkcom
Assistant Examiner—Mark K. Zimmerman
Attorney, Agent, or Firm—Faith F. Driscoll; John S. Solakian

[57] ABSTRACT

A translator is organized to include at least a pair of content addressable memories (CAMs), each for storing a different portion of the total number of bits of each of the words to be translated. The outputs from each CAM are logically combined within a multiple input random access memory (RAM). Both CAMs are interrogated simultaneously and deliver the results of comparing the word portions of an input word and the CAM contents to the RAM in substantially less time then required for a single CAM memory. The results are logically combined with in the RAM which, in response to a match condition, delivers the results of the translation as an output.

32 Claims, 6 Drawing Sheets

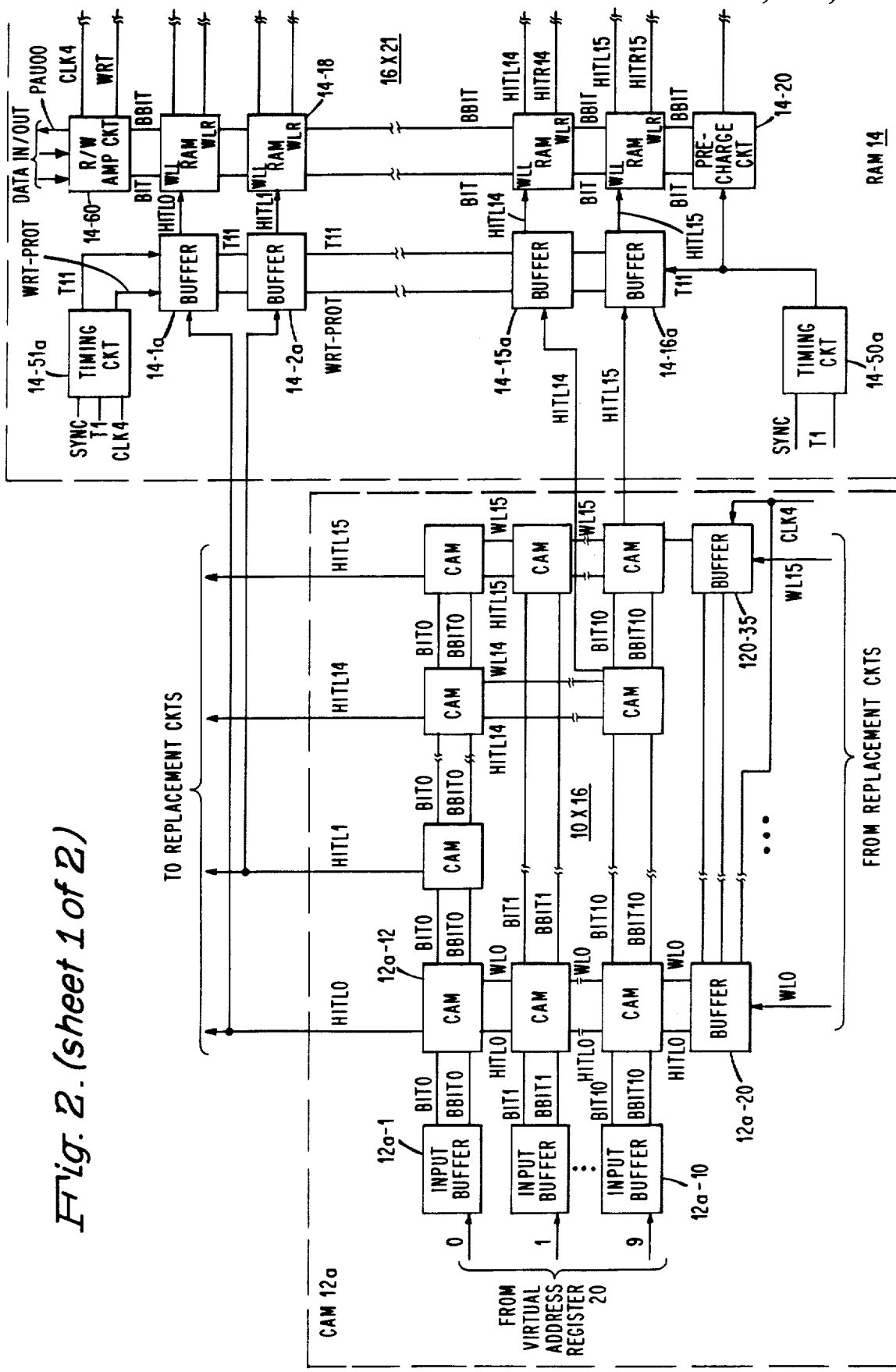
Fig. 2. (sheet 1 of 2)

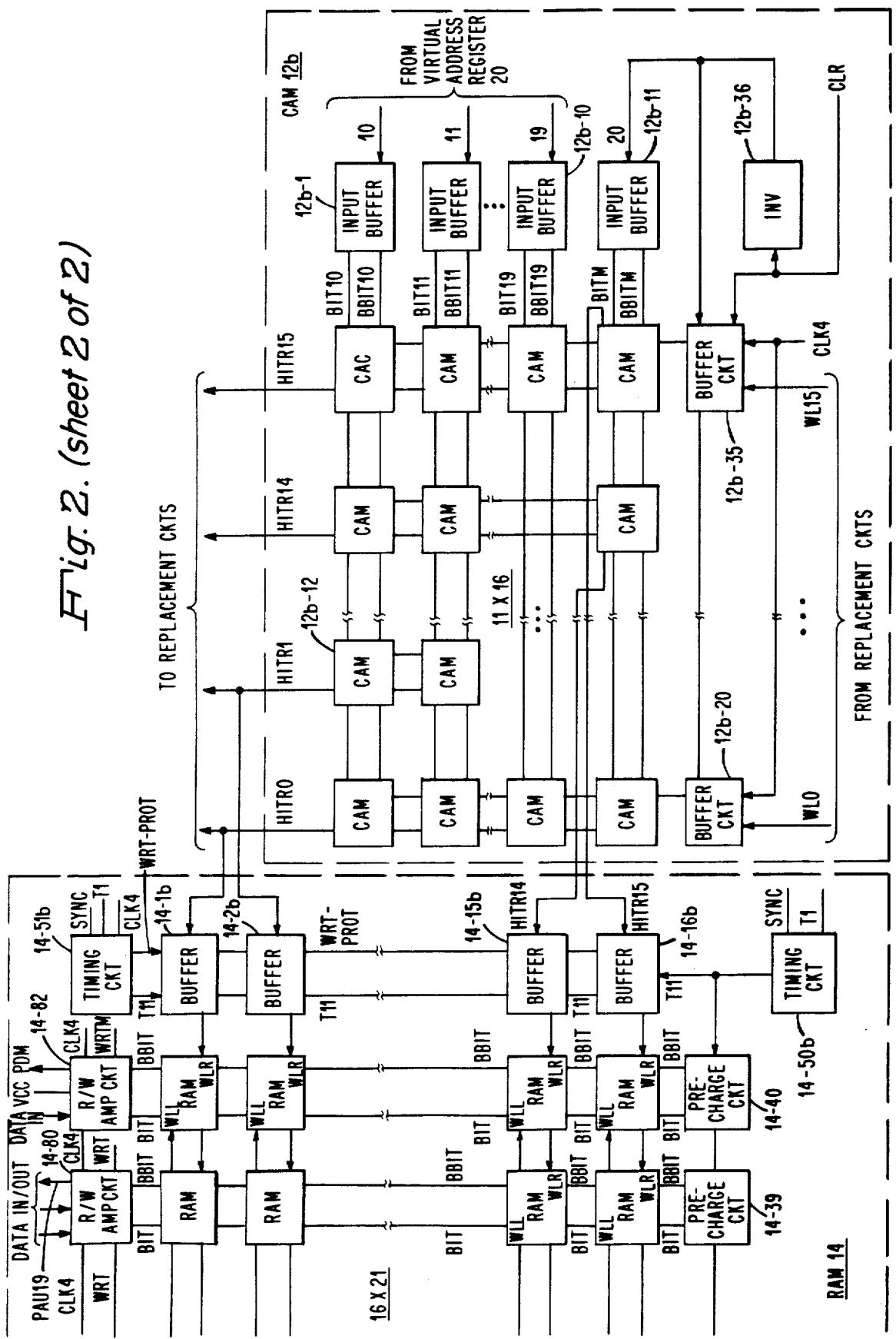
Fig. 2. (sheet 2 of 2)

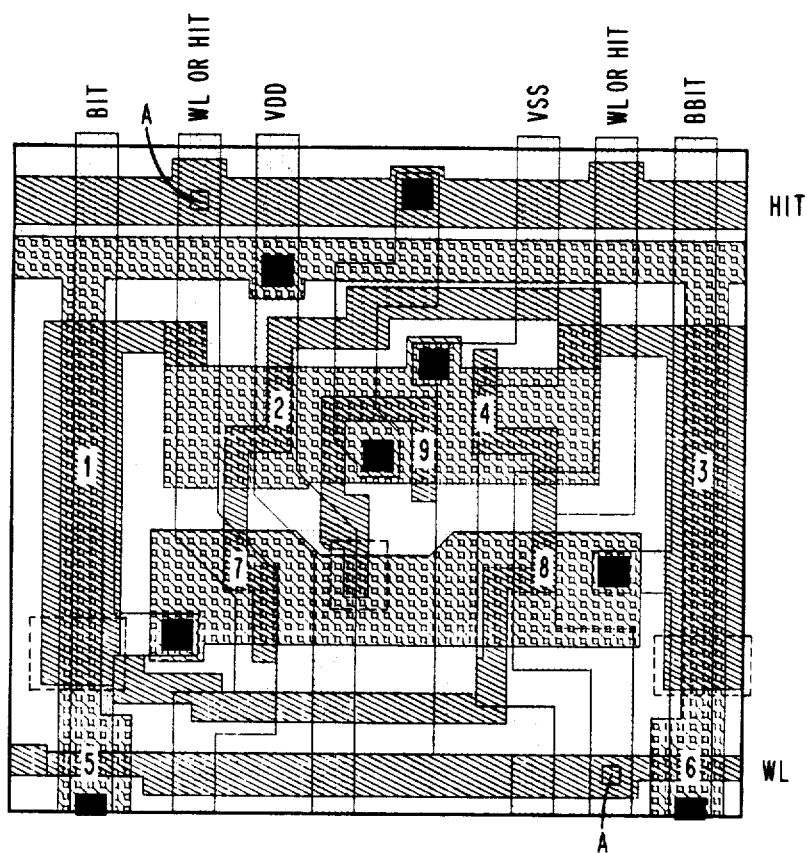
Fig. 4.
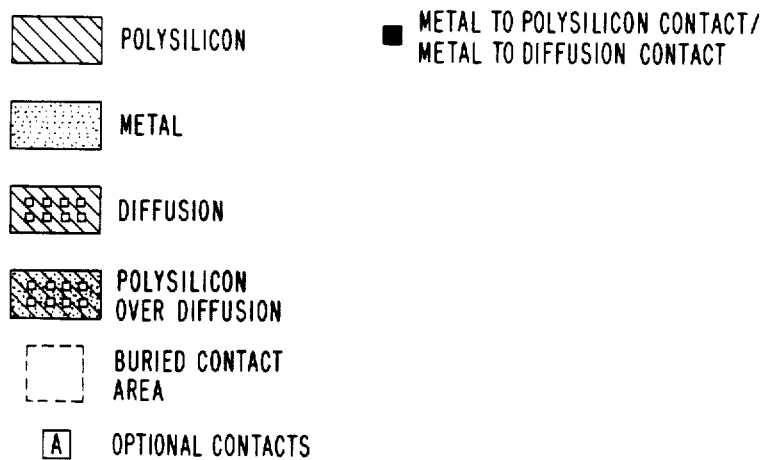

HIGH SPEED HIGH DENSITY DYNAMIC ADDRESS TRANSLATOR

BACKGROUND OF THE INVENTION

1. Field of Use

This invention relates to translators, memories, and more particularly, to content addressable memories for translating virtual addresses into physical addresses.

2. Prior Art

For a number of years, content addressable memories (CAMs) have been used for address development. An example of one such system is disclosed in U.S. Pat. No. 3,800,286 which is assigned to the same assignee as named herein. There, the CAM was used to convert a relative address into one of sixteen hit signals which was encoded into a 4-bit address. The encoded address was then used to select the appropriate physical address word from a buffer memory. The CAM was constructed from TTL content addressable memory chips.

Another more recent prior art system utilizes a controller arrangement which splits the number of virtual block address entries between two CAM arrays. The outputs from the CAM arrays are applied to a read only memory (ROM) array which stores the same number of cache physical addresses. This arrangement simplifies layout requirements for implementing the controller with MOS technology. For further information about this system, reference may be made to the publication by John Chia Lin Hou, MIT, Department of Electrical Engineering and Computer Science, titled, "Design of a Fully Associative Cache Memory Controller", Copyright, 1983.

In many instances, it becomes important to overall system performance to perform translations as fast as possible. This is particularly true when the translation is the first of a series of operations required for instruction execution.

While the prior art use of CAMs was helpful in performing translations, the overall time required to perform such translations has not been fast enough for maintaining high performance levels. This is due to the fact that the translation involves performing a succession of operations such as decoding, comparing, encoding and accessing. In other cases, the comparison operation performed by the CAMs involves entries having a large number of bits requiring a considerable amount of time.

Accordingly, it is a primary object of the present invention to provide a translator capable of performing translations within a minimum of time.

It is a further object of the present invention to provide a translator which is easy to construct using LSI technology and occupies a small chip area.

SUMMARY OF THE INVENTION

The above and other objects of the present invention are achieved in a preferred embodiment of the translator of the present invention which includes at least a pair of content addressable memories (CAMs). Each CAM is arranged to store a different portion of the total number of bits of each of the words to be translated. The cells of each row of each CAM have their outputs connected in common to a single hit line. Corresponding hit line outputs from each CAM are logically combined within the cells of a multiselect input random access memory (RAM). Each row of the RAM stores the translated address for a different one of the words stored by the CAMs.

In operation, both CAMs are interrogated simultaneously. This results in signals being applied to the hit lines for indicating the presence or absence of the word within the translator. In the presence of a match, the selected row of cells of the RAM storing the translated address of the desired word are conditioned by the CAM outputs to read out the translated address contents of the row of cells as an output. By decreasing the length of hit lines and proportionally, the charging propagation time, all of the portions of an entire word can be read out to the RAM in a fraction of the time which a single CAM normally requires. This in turn increases the translator's overall level of performance as well as decrease the power requirements.

In the preferred embodiment, the translator is constructed on a single chip using VLSI technology. The memory cells for the CAMs and RAMs are designed to use a minimum number of transistors and organized to simplify layout and reduce chip area. The CAM layout is designed to include a number of metal lines in different layers which pass through each group of cells in vertical and horizontal directions. This arrangement allows the hit lines and word lines to be oriented in the desired directions for connecting to other sections of the same chip. The result is the arrangement minimizes area, improves efficiency and performance.

The novel features which are believed to be characteristic of the invention, both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE DRAWINGS

FIG. 2 shows in greater detail, the translator of FIG. 1.

FIG. 4 is a plan view drawing of the CAM cell of FIG. 3a constructed in an integrated circuit configuration according to the present invention.

DESCRIPTION OF THE PREFERRED EMBODIMENT

Figure 1:
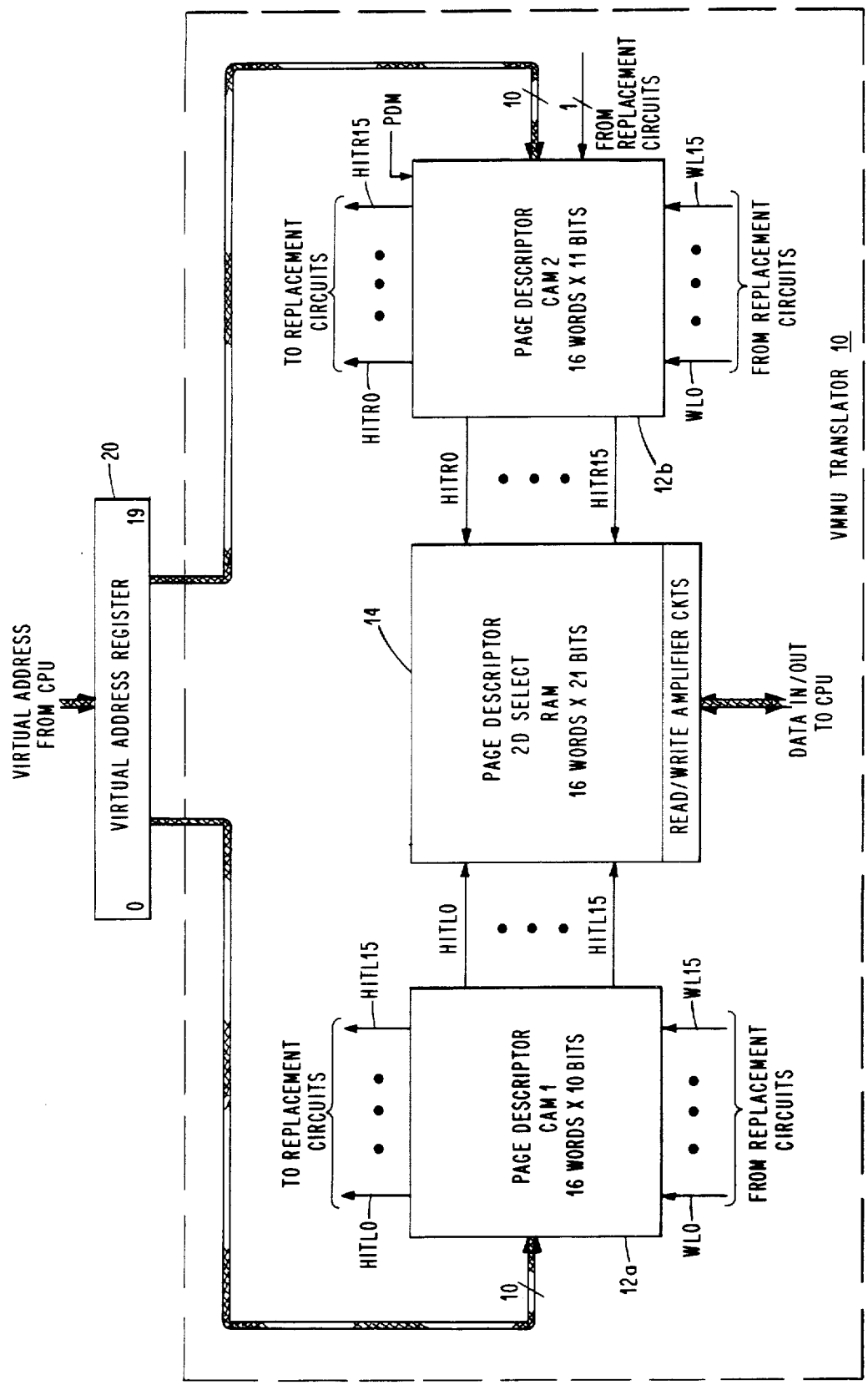
FIG. 1 is a block diagram of the translator of the present invention.

Referring to FIG. 1, it is seen that the translator 10 of the present invention is organized to store page descriptor physical addresses for translating a number of sixteen virtual address entries or words. More specifically, it is constructed to translate a 20-bit virtual page descriptor address applied by a central processing unit (CPU) via a 20-bit virtual address register 20 into a 20-bit physical address within a minimum amount of time.

In greater detail, translator 10 includes a pair of content addressable memories CAMs 12a and 12b. Each of the CAMs 12a and 12b stores a different portion of each of the sixteen page descriptor address words. CAM 12a stores bits 0 through 9 while CAM 12b stores bits 10 through 19 of each page descriptor address word. Bits 0–19 of each page descriptor word are received from a central processing unit (CPU) via register 20 while bit 20 is a validity control bit whose state is established by replacement circuits, not shown. When the address word is written into translator 10, the validity bit is set. The bit is updated in a conventional manner when the address word is modified.

Each of the CAMs 12a and 12b operate to simultaneously compare a different half of a CPU virtual address applied via register 20 with all of the sixteen halves of the 16-page descriptor words stored in the vertical rows or columns of cells of its CAM. When there is an identical comparison between word halves in CAM 12a or 12b, the vertical row of cells detecting the comparison forces a hit line which connects in common to all of the cells of that vertical row to a predetermined state. CAM 12a applies the results of the simultaneous comparisons to hit lines HITL0 through HITL15. These signals are, in turn, applied as a first set of inputs to corresponding horizontal rows of cells for RAM 14. Simultaneously, CAM 12b applies the results of the simultaneous comparisons to hit lines HITR0 through HITR15. These signals are applied as a second set of inputs to the same corresponding horizontal rows of cells of RAM14. The first and second sets of inputs are logically combined within the RAM cells of each row. When there is an identical comparison between both halves of the 20-bit virtual address in CAMs 12a and 112b with the input virtual address, CAMs 12a and 12b force both halves of the same hit line (e.g. HITL0, HITR0 or HITL10, HITR10) to a predetermined state. This enables the corresponding row of RAM cells to read out the translated virtual address into a common set of read/write amplifier circuits. From there, the translated virtual address or physical address is transferred to another part of the CPU and used to fetch the requested data from memory.

As seen from FIG. 1, each of the CAMs 12a and 12b receive input signals from a common set of word lines WL0 through WL15. The word lines WL0 through WL15 are connected to receive signals from replacement circuits, not shown, located in another section of the translator 10. These circuits determine which page descriptor address word in the translator 10 is to be replaced. For the purpose of the present invention, the replacement circuits may be considered conventional in design.

When one of the word lines is forced to a predetermined state, the CAM cells of a vertical row which couple to the word line are enabled to store the signals applied to their word line inputs. The translator 10 can be initialized to store a given set of sixteen-page descriptor address words by successively forcing word lines WL0 through WL15 to a predetermined state.

It will be noted that each of the CAMs 12a and 12b provide two sets of hit lines. A first set which extends in a horizontal direction connects to RAM 14 which is positioned between both CAMs 12a and 12b, and a second set which extends in a vertical direction connects to the replacement circuits which are located above CAMs 12a and 12b. This is accomplished by passing a number of metal lines in one direction and a corresponding number of polylines in an orthogonal direction through each CAM cell. As explained herein, this arrangement allows the hit lines and word lines to be oriented in the desired directions for connecting to other sections of the translator chip. The result is a reduction in area, improved efficiency and performance as explained herein.

FIG. 2 shows in greater detail, the layout of the CAMs and RAM of translator 10. As seen from FIG. 2, CAMs 12a and 12b have the same organization and construction. Each CAM has 160 CAM cells organized into an array of 10 horizontal rows and sixteen vertical rows or columns. The array of CAM 12b has an additional horizontal row reserved for control information. Each CAM includes a plurality of data input buffer circuits (i.e., 12a-1 through 12a-10 and 12b-1 through 12b-11) which receive a different portion of the 20-bit virtual address word to be translated. CAM 12b has an additional input buffer circuit 12b-11 which receives a clear input signal from another part of the chip applied via an inverter circuit 12b-36. Additionally, each CAM has a plurality of word line input buffer circuits (i.e., 12a-20 through 12a-35 and 12b-20 through 12b-35) which receive signals applied to word lines WL0 through WL15 by the translator replacement circuits.

Both groups of input buffer circuits can be considered conventional in design. The input data buffer circuits operate to convert the logic level input data signals into high level complementary bit output signals. The word line buffer circuits which receive a clock signal CLK4 similarly convert the word line signals into high level word line signals. Both the bit output signals and word line signals are applied to each of the CAM cells of the corresponding horizontal and vertical rows as shown.

The CAM cells of the vertical and horizontal rows of each CAM connect internally to horizontal and vertical hit lines as shown. The vertical hit lines (i.e., HITL0 through HITL15 and HITR0 through HITR15) are applied as inputs to the translator replacement circuits. The horizontal hit lines are applied as inputs to the RAM 14.

As shown, RAM 14 has 336 RAM cells organized into an array of sixteen horizontal rows and twenty-one vertical rows or columns. The RAM 14 has two sets of input buffer circuits 14-1a through 14-16a and 14-1b through 14-16b which receive input hit signals from CAMs 12a and 12b respectively. They also receive timing and synchronous signals T1, CLK4 and SYNC from a central timing source via timing circuits 14-50a, 14-50b, 14-51a and 14-51b. The cells of the RAM 14 are precharged by a plurality of precharge circuits 14-20 through 14-40. These circuits operate in response to timing and synchronization signals T1 and SYNC received via circuits 14-50a and 14-50b. Information is read from and written into the RAM cells via a plurality of read/write amplifier circuits 14-60 through 14-82. As shown, these circuits receive timing and write control signals CLK4 WRT and WRT-M from the same central timing circuits.

For the purpose of the present invention, the input buffer circuits, precharge circuits, read/write amplifier circuits and timing circuits may be considered conventional in design. Each of the input buffer circuits 14-1a through 14-16a and 14-11b through 14-16b, respectively, operate to convert the hit signals received from CAMs 12a and 12b into the appropriate logical levels for application as an input to RAM cells of one horizontal row. Each of the precharge circuits 14-20 through 14-40 operate to precharge a different one of the pairs of complementary bit lines BIT and BBIT to the same predetermined high voltage level. The read/write amplifier circuits operate to sense the state of the information being applied to the BIT and BBIT lines during a read cycle of operation and to write information via the same lines during a write cycle of operation, in response to signals WRT and WRT-M.

Figure 3A:
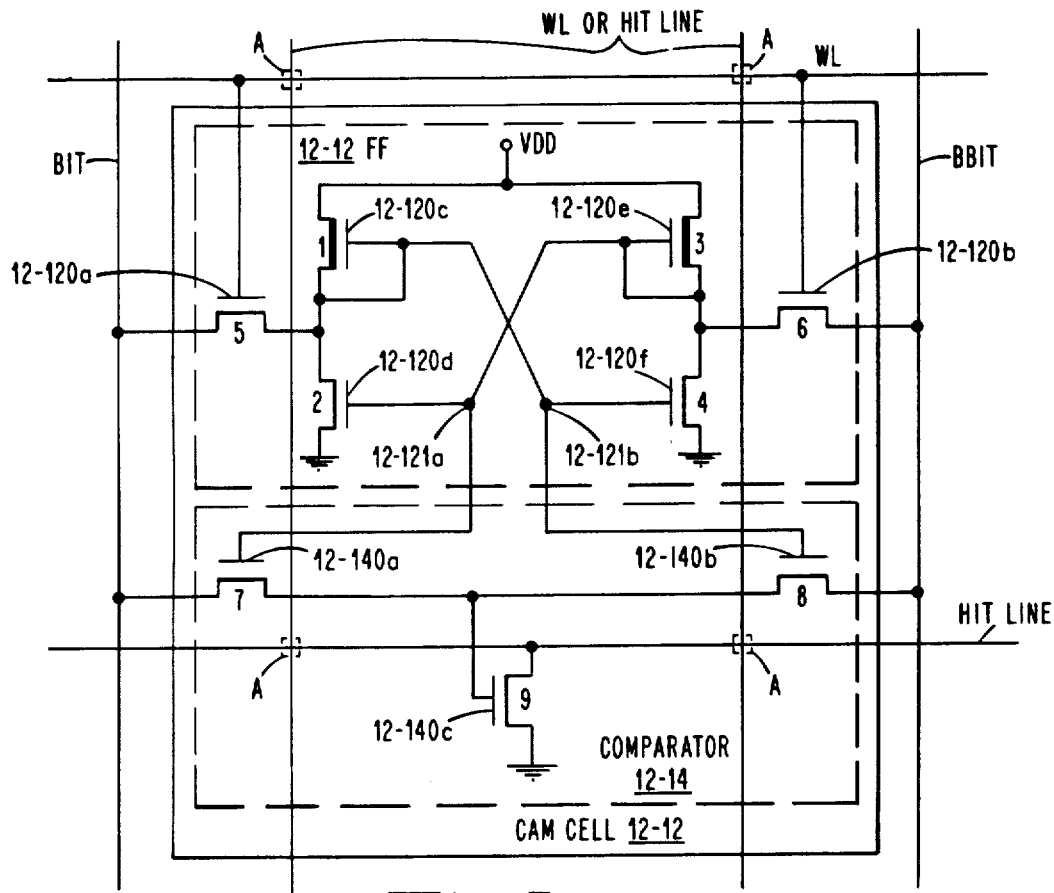
FIGS. 3a and 3b show the CAM and RAM cells used in constructing the CAMs and RAMs of FIG. 1.
Figure 3B:
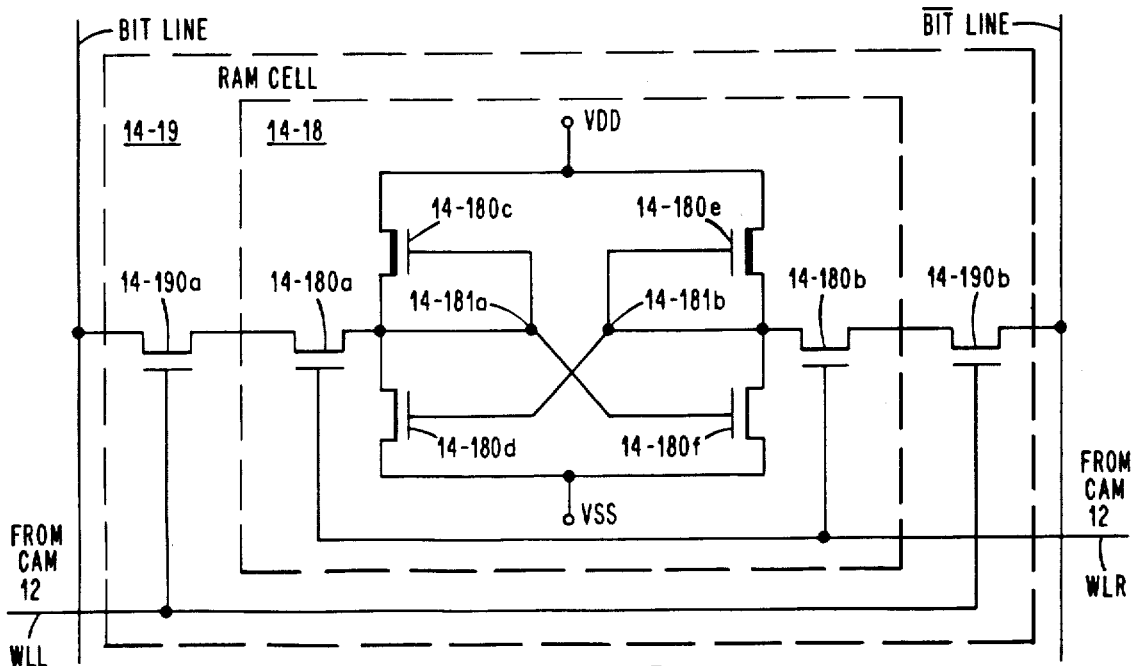

The arrays of CAMs 12a and 12b and RAM 14 are constructed from the CAM and RAM cells of FIGS. 3a and 3b. Both the CAM and RAM cells employ NMOS FET transistor technology. According to the present invention, the CAM cell is designed to utilize a small number of transistors numbered 1 through 9 configured to reduce delays and reduce the space requirements. As seen from FIG. 3a, the CAM cell 12a-12 includes a flip-flop section 12-120 and a match or compare section 12-140. The flip-flop section 12-120 includes a pair of input inverter FET transistors 12-120a and 12-120b and FET transistors 12-120c through 12-120f which are connected to form a bistable element having two stable states with the potential of storage nodes 12-121a and 12-121b either at voltage VDD or at zero volts. A binary ONE is stored in the cell when storage node 12-121a is at ground and storage node 12-121b is at VDD potential. At the quiescent state, the word line WL is held at ground potential which holds transistors 12-120a and 12-120b in the off state. This isolates the cell from bit lines BIT and BBIT.

The comparator section 12-140 include transistors 12-140a and 12-140b which connect to form an exclusive OR gate. The output of the exclusive OR gate connects to the gate of the transistor 12-140c which represents the pull down of an OR logic gate for the hit line. The gate terminals of the transistors 12-140a and 12-140b connect to nodes 12-121a and 12-121b, respectively. Transistor 12-140a will be on when a binary ZERO is stored in the cell while transistor 12-140b will be on when a binary "ONE" is stored in the cell. The hit line normally remains at +VDD volts unless there is a mismatch between the information being searched and the contents of the cell.

To perform a search operation, the information being searched establishes the states of the BIT and BBIT lines. For binary ONE information, the BIT line is raised to VDD volts while the BBIT line remains at ground. For binary ZERO information, the BIT and BBIT lines assume opposite values. When a binary ONE is stored in the cell and the bit lines are set to a binary ONE, a match is detected by comparator section 12-140. This results in the hit line remaining at the voltage VDD. When the bit lines are set to a binary ZERO, comparator section 12-140 detects a mismatch which forces the hit line to ground potential.

Writing is accomplished by forcing the word line to a predetermined voltage and switching both the BIT line and BBIT line to opposite polarities depending on whether a binary ONE or binary ZERO is to be written into the cell.

As explained herein, two additional metal lines pass through the area of each CAM cell as shown in FIG. 3a. This arrangement allows the word lines and hit lines to be oriented in both vertical and horizontal directions at the same time for ease of connection to other sections of the same chip. That is, the dotted rectangular boxes labeled "A", placed at the line interconnection in FIG. 3a, represent optional connections for the word and hit lines.

Thus, the same CAM design can be used in several different orientations and used to construct several different units. The result is that valuable chip space is minimized with attendant improvements in efficiency and performance. In the present embodiment, the hit lines run both vertically and horizontally. Thus, the space between the CAMs 12a and 12b and RAM 14 can be compressed substantially reducing space and delays.

This arrangement is illustrated in greater detail by the integrated circuit configuration of FIG. 4. For ease of identification, the transistor circuit elements of FIG. 3a are indicated in FIG. 4 by reference numbers 1 through 9. The first level metalization line typically polycrystalline silicon (poly), suitable for use as gate electrodes and as electrical connections are indicated by the slant hatch lines running in a direction from upper left to lower right. The second level metalization lines, typically aluminum, suitable for interconnections are indicated by the dot pattern in FIG. 4. The localized impurity diffused or implanted zones of relatively high conductivity located at the surface of the underlying semiconductor, suitable for use as source and drain zones or as interconnections are indicated by the combination of slant lines and squares pattern. The interconnection of a first level metalization with a diffused zone or a buried contact is indicated by the combined patterns of the slant hatch lines and the combination of slant lines and squares included in the dotted areas. The solid squares denote interconnections or contacts made by a second level metalization with a first level metalization, or a second level of metalization with a diffused zone. The numbers 1 through 9 denote the location of transistors 12-120a through 12-140c of FIG. 3a.

As seen from FIG. 4, each CAM cell has two first level metalization lines or polylines and four second level metalization lines or metal lines excluding power and ground lines VDD and VSS. In FIG. 4, the polylines run in a horizontal direction and are labeled HIT and WL. The metal lines run in a vertical direction and are labeled BIT, BBIT and WL or HIT as shown. The internal connections within each CAM cell define the directions of the word (WL) and hit lines. The direction can be made to conform to the locations of the surrounding sections.

From FIG. 2, it is seen that the inputs BIT and BBIT to the CAMs enter at the right and at the left, the word lines enter at the bottom and the HIT lines exit in both vertical and horizontal directions. In the embodiment of the FIG. 2, the CAM cell of FIG. 4 is rotated by ninety degrees (90°), so that the four metal lines now run horizontally and provide the BIT and BBIT inputs and HIT outputs in the same direction. Internally within the CAM cell, the polyline for the HIT line is connected to the metal line which changes the direction of the hit line. By being able to use metal lines for hit signals, the time for transmitting hit signals is reduced because of the greater conductivity of metal lines as compared to polylines. Also, the layout is simplified because it optimizes the routing of HIT and WL lines to the RAM 14 and the replacement circuits (not shown).

FIG. 3b depicts the RAM cell of the present invention. As seen from the Figure, RAM cell 14-18 includes a conventional flip-flop section 14-180 and a gate section 14-190. The flip-flop section 14-180 includes input pass transistors 14-180a and 14-180b and transistors 14-180c through 14-180f connected to form a bistable storage element having two stable states. That is, the nodes 14-181a and 14-181b are either at voltage VDD or VSS depending on whether the cell is storing a binary ONE or a binary ZERO. Both transistors 14-180a and 14-180b are normally off which isolates the cell from the bit lines BIT and BIT.

In accordance with the invention, a pair of pass transistors 14-190a and 14-190b are connected in series with pass transistors 14-180a and 14-180b, respectively. The gate of each pair of the series pass transistors are connected to ones of the word lines WLL and WRL as shown. The result is that the contents of the bistable storage element are read out or written only when both word lines WLL and WLR are in the same predetermined state indicative of a hit condition (i.e., a voltage potential of VDD volts).

DESCRIPTION OF OPERATION

Figure 5:
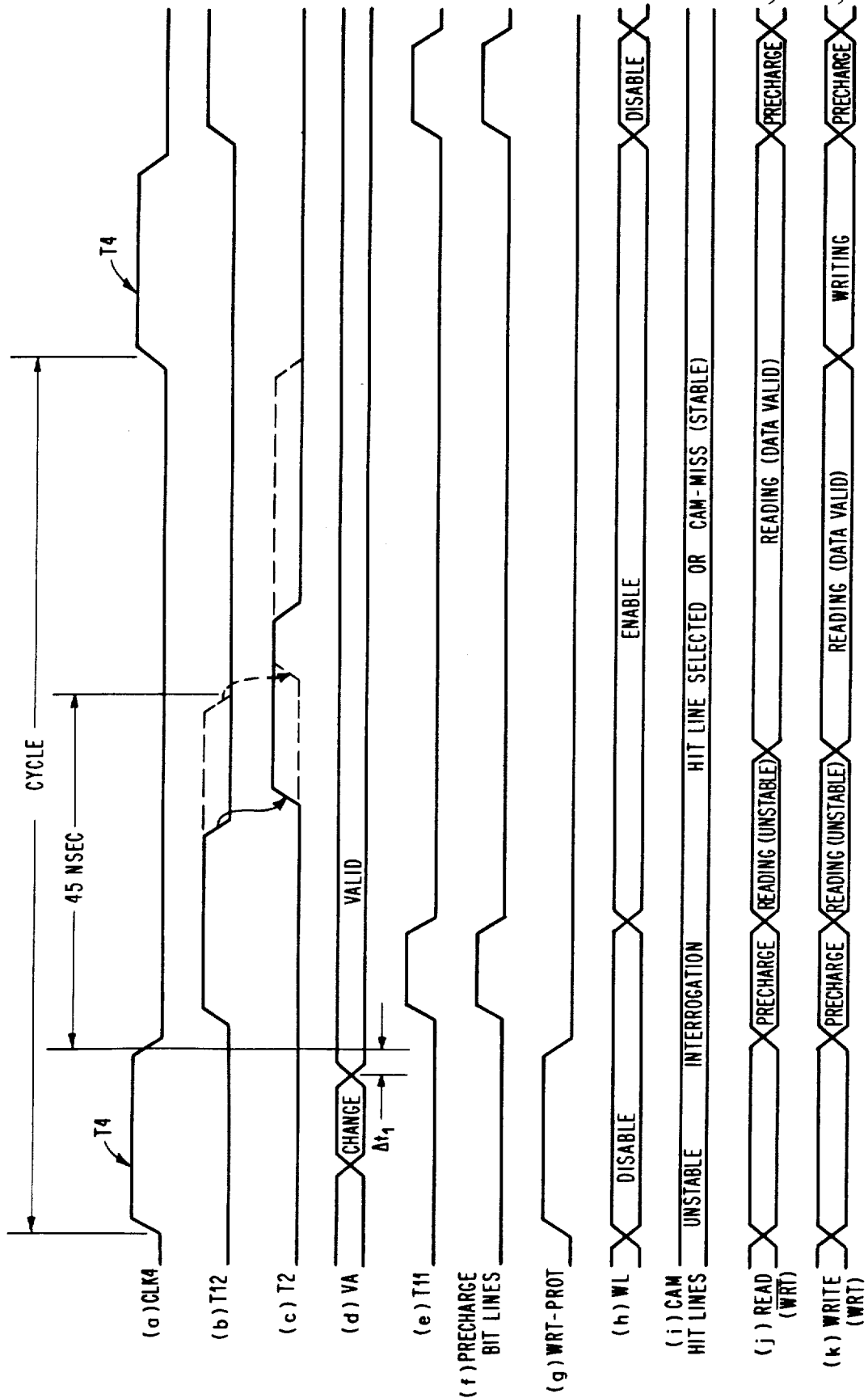
FIG. 5 is a timing diagram used to explain the operation of the translator of the present invention.

With reference to FIGS. 1, 2, 3a and 3b, the operation of the translator 10 will now be described with reference to the timing diagram of FIG. 5. As indicated by waveform a, each cycle starts at the beginning of time interval T4 when signal CLK4 is forced to a binary ONE. During time interval T4, the CPU loads the register 20 of FIG. 1 with a new virtual address. This results in a change in the virtual address signals as indicated by waveform d.

In the meantime, the CAMs 12a and 12b are constantly interrogating or searching for the information applied as its inputs (see waveform i). By using the virtual address signals from an initial stage within register 20, interrogation can be started earlier as indicated by the Δ tl interval of waveforms a and d.

The circuits 14-51a and 14-51b of FIG. 2 forces WRT-PROT signal to a binary ONE when register 20 is loaded with a virtual address, and signal CLK4 is a binary ONE as shown by waveforming a and g.

To ensure that the information is preserved between successive read cycles of operation, the bit lines of each vertical row of RAM cells are precharged during the time interval defined by signal T11 by circuits 14-20 through 14-40 to a positive voltage VDD (see waveforms e and f). At that time, the input buffer circuits 14-1a through 14-16a and 14-1b through 14-16b are also disabled by signals T11 from timing circuits 14-50a, 14-50b, 14-51a and 14-51b. This results in the word lines of the RAM being forced to binary ZEROS or disabled as indicated by waveform h. This prevents any information from being selected during the precharge interval as well as the time during which the virtual address may be changed by the CPU. Thus, as shown by waveform h, the word lines of the RAM are also disabled during time interval T4 defined by signal CLK4.

At the end of the time interval defined by signal T11, the RAM input buffer circuits are enabled and the hit lines from CAMs 12a and 12b are stable. At this time, information is ready to be read out from the horizontal row of RAM cells jointly selected by CAMs 12a and 12b upon the detection of an identical comparison or match between the CAM words half contents and CPU virtual address halves applied via register 20. This is denoted by signals being simultaneously applied to both the left and right halves of the same hit line which connect to the inputs of the selected horizontal row of RAM cells (e.g. HITRO, HITLO).

During the time interval defined by signal T2, the information read out from the selected row of RAM cells is valid (see waveform j). This point occurs no later than 45 nanoseconds following the change in the virtual address as indicated by solid and dotted portions of waveforms a and c. The information remains valid until the next precharge interval as shown by waveform j. The information read out from the selected row of RAM cells is sensed by the read/write circuits 14-60 through 14-80 during the time interval defined by signal T2.

As seen from waveform k, information can be written into the selected row of RAM cells during the interval labeled writing. This is done by forcing write signals WRT and WRT-M to binary ONES. At that time, the signals applied to read/write circuits 14-60 through 14-80 are written into the selected row of RAM cells.

Because of the arrangement of the present invention, the requested translated information is made available within a minimum amount of time following the change in virtual address signals. This fast response time allows the remainder of the system to operate at maximum speed.

Those skilled in the art will recognize that many changes may be made to the preferred embodiment of the present invention without departing from its teachings. For example, the invention may be used with different types and configurations of memory cells implemented using different technologies.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A translator comprising:
   a plurality of content addressable memories (CAMs), each CAM for storing a different portion of each of a number of words representative of single entities to be translated and each said CAM containing a number of groups of bit cells, a number of hit lines, each of said bit cells within each said group being connected in common to a different one of said hit lines;
   a random access memory (RAM) having a plurality of bit cells arranged in a number of rows, each of which stores one of a number of translated words, each of said bit cells including logic means, said logic means of each cell of each row being connected in common to said different one of said number of hit lines which connects to a corresponding group of CAM bit cells within each of said plurality of CAMs; and,
   means for simultaneously applying to each of said CAMs, signals corresponding to said different portion of a word to be translated, said bit cells of each CAM comparing said different portion of said word to said number of words and generating hit signals representative of the results of said comparing on said plurality of hit lines for delivery to RAM cells within an amount of time which decreases proportionally as a function of said plurality of CAMs, said logic means of each row being conditioned by said hit signals from each of said CAMs to select as an output, a corresponding one of said translated words from said RAM only if all of said signals from said group of cells within each of said plurality of CAMs simultaneously indicate a hit condition.

2. The translator of claim 1 wherein said number of CAMs is two and each of said logic means of each bit cell of each row has two inputs, said inputs being connected to said hit lines from corresponding groups of bit cells within said CAMs.

3. The translator of claim 2 wherein said logic means includes an AND gate.

4. The translator of claim 1 is constructed in VLSI form using first and second types of layers of metalization.

5. The translator of claim 4 wherein said first and second types of layers of metalization include a number of polysilicon and metal lines respectively.

6. The translator of claim 1 wherein each of said CAM cells comprises:
- a random access memory (RAM) cell having a pair of output lines;
- a number of transistors interconnected to form an exclusive OR gate, said gate having first and second pairs of inputs and an output, said first pair of inputs being connected to said pair of output lines, said second pair of inputs being connected to receive complementary input signals representative of one of said signals corresponding to said different portion and said output being connected to one of said plurality of hit lines, said exclusive OR gate comparing the contents of said RAM cell to said complementary input signals and forcing said hit lines to a predetermined state for signalling an identical comparison or a match between said first and second pairs of inputs.

7. The translator of claim 5 wherein each of said CAM cells further includes a number of metalization lines positioned to pass through said CAM cell in horizontal and vertical directions for connection as a hit line in said group of CAM cells in a selected direction.

8. The translator of claim 1 wherein said RAM further includes each of a number of pairs of complementary bit lines, each of said bit cells including:
- a random access memory (RAM) cell section for storing a bit of one of said number of translated words and having a pair of output lines; and
- a plurality of transistors connected to form a pair of AND gates, each of said AND gates having a plurality of inputs and an output, a first one of said inputs of each AND gate connected in common to one of said hit lines of one of said CAMs, a second one of said inputs of each said AND gate being connected in common to one of said hit lines of another one of said CAMs, a third one of said inputs of each said AND gate being connected to one of said pair of RAM output lines and said output of each said AND gate being connected to a different one of said pair of complementary bit lines, said pair of AND gates being conditioned by a coincidence of signals on said hit lines from said plurality of CAMs to apply complementary output signals to said bit lines representative of said bit of said one of said number of said translated words.

9. The translator of claim 8 wherein each said pair of AND gates includes a pair of transistors, each transistor having a control input and first and second output terminals, said control input of a first one of said transistors of each AND gate being connected in common to said one hit line of one of said CAMs, said control input of a second one of said transistors of said each AND gate being connected in common to said one hit line of said other one of said CAMs, said first output terminal of said first one of said transistors of each AND gate being connected to a different one of said complementary bit lines, said second output terminal of said first one of said transistors being connected to said second output terminal of said second one of said transistors of each AND gate and said first output terminal of said second one of said transistors of each AND gate being connected to a different one of said RAM output lines.

10. The translator of claim 1 wherein said translator is constructed from semiconductor material having a predetermined area, said RAM having a predetermined shape and being centrally located within said area, said RAM having one of said number of CAMs being positioned adjacent to each side of said predetermined shaped RAM.

11. A translator comprising:
- a plurality of content addressable memories (CAMs), each CAM having an array for storing a different portion of each of a number of words to be translated, each said array including a plurality of hit lines, a plurality of bit lines and a plurality of bit cells organized into a number of rows and columns, said bit cells within each of said columns being connected in common to a different one of said hit lines and said cells within each of said rows being connected in common to a different one of said bit lines;
- a random access memory (RAM) having an array for storing a number of translated words, said array including a plurality of bit cells arranged into a number of rows and columns, said number of columns corresponding to the sum of the number of columns of said plurality of CAMs, each of said bit cells including logic means, said logic means of each cell of a different one of said rows being connected in common to said different one of said plurality of hit lines of which connects to a corresponding one of said column of cells within each of said plurality of CAMs; and,
- means for simultaneously applying to said plurality of bit lines of each of said CAM, signals corresponding to said different portion of a word to be translated, said bit cells of each column of each CAM comparing said different portion of said word to corresponding portions of said number of words and generating hit signals on said plurality of hit lines for delivery to RAM cells within an amount of time which decreases proportionally as a function of the number of CAMs, said logic means of each cell of one of said number of rows being enabled only by a coincidence of said hit signals from said corresponding columns within said plurality of said CAMs to select as an output, one of said translated words from said one of said RAM rows.

12. The translator of claim 11 wherein said plurality of CAMs is two and each of said logic means has two inputs, each connected to one of said hit lines from said corresponding column of bit cells within each of said CAMs.

13. The translator of claim 12 wherein said logic means includes an AND gate.

14. The translator of claim 11 is constructed in VLSI form using first and second types of layers of metalization.

15. The translator of claim 14 wherein said first and second types of layers of metalization include polysilicon and metal lines respectively.

16. The translator of claim 14 wherein said plurality of bit lines include a plurality of pairs of complementary bit lines, each of said CAM cells comprising:
- a random access memory (RAM) cell having a pair of output lines;

a number of transistors interconnected to form an exclusive OR gate, said gate having first and second pairs of inputs and an output, said first pair of inputs being connected to said pair of output lines, said second pair of inputs being connected to one of said plurality of pairs of complementary bit lines and said output of said gate being connected to one of said plurality of hit lines, said exclusive OR gate comparing the content of said RAM cell to input signals applied to said complementary bit lines and forcing said hit line to a predetermined state upon detecting an identical comparison or a match between the signals applied to said first and second pair of inputs as a result of performing an exclusive OR operation thereof.

17. The translator of claim 16 wherein each of said CAM cells further includes a pair of metal lines positioned to pass through said CAM cell in horizontal and vertical directions for connection as a hit line in said array of CAM cells in a selected direction.

18. The translator of claim 11 wherein said RAM further includes a number of pairs of complementary bit lines, each of said bit cells including:
   a random access memory (RAM) cell section for storing a bit of one of said number of translated words and having a pair of output lines; and
   a plurality of transistors connected to form a pair of AND gates, each of said AND gates having a plurality of inputs and an output, a first one of said inputs of each AND gate connected in common to one of said plurality of hit lines of one of columns of CAM cells of one of said CAMs, a second one of said inputs of each said AND gate being connected in common to one of said hit lines of the same column of CAM cells of another one of said CAMs, a third one of said inputs of each said AND gate being connected to one of said pair of RAM output lines and said output of each said AND gate being connected to a different one of said pair of complementary bit lines, said pair of AND gates being conditioned by a coincidence of signals on said plurality of hit lines from said plurality of CAMs to apply complementary output signals to said bit lines representative of said bit of said one of said number of translated words.

19. The translator of claim 18 wherein each said pair of AND gates includes a pair of transistors, each transistor having a control input and first and second output terminals, said control input of a first one of said transistors of each AND gate being connected in common to said one hit line of one of said CAMs, said control input of a second one of said transistors of said each AND gate being connected in common to said one hit line of said other one of said CAMs, said first output terminal of said first one of said transistors of each AND gate being connected to a different one of said complementary bit lines, said second output terminal of said first one of said transistors being connected to said second output terminal of said second one of said transistors of each AND gate and said first output terminal of said second one of said transistors of each AND gate being connected to a different one of said RAM output lines.

20. The translator of claim 11 wherein said translator is constructed from semiconductor material having a predetermined area, said RAM having a predetermined shape and being centrally located within said area, said RAM having one of said plurality of CAMs being positioned adjacent to each side of said RAM.

21. The translator of claim 11 wherein said plurality of hit lines correspond in number to said number of columns in said plurality of CAMs.

22. A translator for translating a virtual address into a physical address, said virtual address being divided into X/n number of bits wherein X and n are whole integers and n has a value greater than one, said translator comprising:
   the number of content addressable memories (CAMs), each CAM having an array for storing a different portion of each of a number of words to be translated, said array including a plurality of bit cells organized into X/n number of rows and Y number of columns wherein Y is a whole integer, Y number of hit lines and X/n number of pairs of bit lines, said bit cells within each different column being connected in common to a different one of said hit lines and said cells within a different row being connected in common to a different pair of said bit lines;
   a random access memory (RAM) having an array for storing Y number of translated words, said array including a plurality of bit cells arranged into Y number of rows and m number of columns wherein m is a whole integer, each of said bit cells including logic means, said logic means of said cells of each one of said rows being connected in common to a different one of said Y number of hit lines of a corresponding column of cells of each CAM; and,
   means for simultaneously applying to said X/n number of pairs of bit lines of each of said CAMs, signals representative of a different portion of said X/n address bits of a word to be translated, said bit cells of each column of each CAM comparing said X/n address bits of said word to said different portions of said Y number of words and generating hit signals on said plurality of hit lines for delivery to RAM cells indicating the results of the comparison within an amount of time which decreases as a function of n, said logic means of each row being enabled only by a coincidence of said hit signals from each of said CAMs to select as an output, one of said translated words from one of said RAM rows from corresponding columns within said n number of CAMs.

23. The translator of claim 22 wherein n is two and each of said logic means has two inputs, said inputs of said logic means of each row being connected to said hit lines from said corresponding columns of bit cells within said CAMs.

24. The translator of claim 23 wherein said logic means includes an AND gate.

25. The translator of claim 22 is constructed in VLSI form using first and second types of layers of metalization.

26. The translator of claim 25 wherein said plurality of bit lines include a plurality of pairs of complementary bit lines and each of said CAM cells comprising:
   a random access memory (RAM) cell having a pair of output lines;
   a number of transistors interconnected to form an exclusive OR gate, said gate having first and second pairs of inputs and an output, said first pair of inputs being connected to said pair of output lines, said second pair of inputs being connected to one of said plurality of pairs of complementary bit lines and said output of said gate being connected to one of said plurality of hit lines, said exclusive OR gate comparing the content of said RAM cell to input signals applied to said complementary bit lines and forcing said hit line to a predetermined state upon detecting an identical comparison or a match between the signals applied to said first and second pair of inputs as a result of performing an exclusive OR operation thereon.

27. The translator of claim 26 wherein each of said CAM cells further includes a number of metal lines positioned to pass through said CAM cell in horizontal and vertical directions for connection as a hit line in said array of CAM cells in a selected direction.

28. The translator of claim 22 wherein said RAM further includes a pair of complementary bit lines, each of said bit cells including:

a random access memory (RAM) cell section for storing a bit of one of said number of translated words and having a pair of output lines; and a plurality of transistors connected to form a pair of AND gates, each of said AND gates having a plurality of inputs and an output, a first one of said inputs of each AND gate connected in common to one of said plurality of hit lines of one of columns of CAM cells of one of said CAMs, a second one of said inputs of each said AND gate being connected in common to one of said hit lines of the same column of CAM cells of another one of said CAMs, a third one of said inputs of each said AND gate being connected to one of said pair of RAM output lines and said output of each said AND gate being connected to a different one of said pair of complementary bit lines, said pair of AND gates being conditioned by a coincidence of signals on said plurality of hit lines to apply complementary output signals to said bit lines representative of said bit of said one of said number of said translated words.

29. The translator of claim 28 wherein each said pair of AND gates includes a pair of transistors, each transistor having a control input and first and second output terminals, said control input of a first one of said transistors of each AND gate being connected in common to said one hit line of one of said CAMs, said control input of a second one of said transistors of said each AND gate being connected in common to said one hit line of said other one of said CAMs, said first output terminal of said first one of said transistors of each AND gate being connected to a different one of said complementary bit lines, said second output terminal of said first one of said transistors being connected to said second output terminal of said second one of said transistors of each AND gate and said first output terminal of said second one of said transistors of each AND gate being connected to a different one of said RAM output lines.

30. The translator of claim 23 wherein said translator is constructed from semiconductor material having a predetermined area, said RAM having a substantially rectangular shape and being centrally located within said area, said RAM having one of said CAMs being positioned adjacent to each side of said rectangular-shaped RAM.

31. For use in a translation device, a random access memory (RAM) array for storing a number of words, said array including a plurality of rows of bit cells and a plurality of pairs of complementary bit lines, each of said bit cells including:

a random access memory (RAM) cell section for storing a bit of one of said words and having a pair of outputs; and at least two sets of transistors, each transistor having a control input and first and second output terminals, said control input of a first one of said each set of transistors being connected to one of a pair of select lines which couple to a pair of sources, said control input of a second one of said each set of transistors being connected to the other one of said pair of select lines, said first output terminal of said first one of each set of said transistors being connected to one of a pair of complementary bit lines, said second output terminal of said first one of said each set of transistors being connected to said second output terminal of said second one of said each set of transistors and said first output terminal of said second one of said each set of transistors being connected to one of said pair of outputs, said sets of transistors of said each RAM cell being enabled only if signals are jointly applied to both select lines of said pair of select lines from said sources to apply complementary output signals on said pair of bit lines representative of said bit.

32. For use in a VLSI translation device having a plurality of sections, a content addressable memory (CAM) for storing at least a portion of each of a number of words consisting of a number of bits to be translated, said CAM containing a group of bit cells located in a first one of said sections, a number of pairs of bit lines, a number of hit lines, each of said bit cells within said group being connected in common to one of said hit lines, each of said CAM cells comprising:

a random access memory (RAM) cell having a pair of output lines;

a plurality of transistors interconnected to form an exclusive OR gate, said gate having first and second pairs of inputs and an output, said first pair of inputs being connected to receive a first pair of complementary input signals from said pair of RAM cell output lines, said second pair of inputs being connected to receive a second pair of complementary input signals from one of said number of pairs of bit lines of each said CAM cell representative of one of said bits and said output being connected to one of said plurality of hit lines, said gate comparing the contents of said RAM cell to said second pair of complementary input signals and forcing said hit line to a predetermined state signalling an identical comparison or a match between said first and second pairs of inputs; and first and second types of metalization lines respectively passing through each said CAM cell in first and second directions which are orthogonal to each other, said output of said gate being connected to said first and second types of metalization lines selected as said hit line for transferring signals on said hit line in said directions, said hit line corresponding to said first type of metalization line being connected to a second one of sections located in said first direction and which requires receipt of said signals within a minimum amount of time and said hit line corresponding to said second type of metalization line being connected to a third one of said sections located in said second direction and which does not require said receipt of said signals within said minimum amount of time.

* * * * *